(12) United States Patent
Takahashi et al.

(10) Patent No.: US 11,862,471 B2
(45) Date of Patent: Jan. 2, 2024

(54) MANUFACTURING METHOD FOR SEMICONDUCTOR DEVICE

(71) Applicant: Kioxia Corporation, Tokyo (JP)

(72) Inventors: Atsushi Takahashi, Yokkaichi (JP); Ayata Harayama, Yokkaichi (JP); Yuya Nagata, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/471,684

(22) Filed: Sep. 10, 2021

(65) Prior Publication Data

US 2022/0238345 A1    Jul. 28, 2022

(30) Foreign Application Priority Data

Jan. 28, 2021 (JP) .................................. 2021-012340

(51) Int. Cl.
*H01L 21/3065* (2006.01)
*H01L 21/306* (2006.01)
*H01J 37/305* (2006.01)

(52) U.S. Cl.
CPC ...... *H01L 21/3065* (2013.01); *H01J 37/3053* (2013.01); *H01L 21/30604* (2013.01); *H01J 2237/3341* (2013.01)

(58) Field of Classification Search
None
See application file for complete search history.

(56) References Cited

U.S. PATENT DOCUMENTS

| | | | |
|---|---|---|---|
| 4,803,181 A | 2/1989 | Buchmann et al. | |
| 9,997,372 B2 | 6/2018 | Briggs et al. | |
| 2016/0343580 A1* | 11/2016 | Hudson | H01L 21/67069 |
| 2018/0151346 A1* | 5/2018 | Blanquart | H01L 21/0217 |
| 2019/0189423 A1 | 6/2019 | Ishino et al. | |
| 2021/0265169 A1* | 8/2021 | Yamaguchi | H01L 21/67109 |
| 2022/0076961 A1 | 3/2022 | Takahashi | |

FOREIGN PATENT DOCUMENTS

| | | |
|---|---|---|
| JP | 6-20062 B2 | 3/1994 |
| JP | 3050965 B2 | 6/2000 |
| JP | 2018-195661 A | 12/2018 |
| JP | 2019-110275 A | 7/2019 |
| JP | 2022-45178 A | 3/2022 |

OTHER PUBLICATIONS

Gasvoda, et al., "Surface prefunctionalization of SiO₂ to modify the etch per cycle during plasma-assisted atomic layer etching", Journal of Vacuum Science & Technology A 37, 051003, 2019, 11 pages.

* cited by examiner

*Primary Examiner* — Stephanie P Duclair
(74) *Attorney, Agent, or Firm* — Oblon, McClelland, Maier & Neustadt, L.L.P.

(57) ABSTRACT

A manufacturing method for a semiconductor device according to an embodiment includes performing first etching for forming a recess in a layer to be processed using a reactive ion etching method, performing a first treatment of supplying a silylation agent to the recess after the first etching, and performing second etching of etching at least a bottom surface of the recess using a reactive ion etching method after the first treatment.

22 Claims, 7 Drawing Sheets

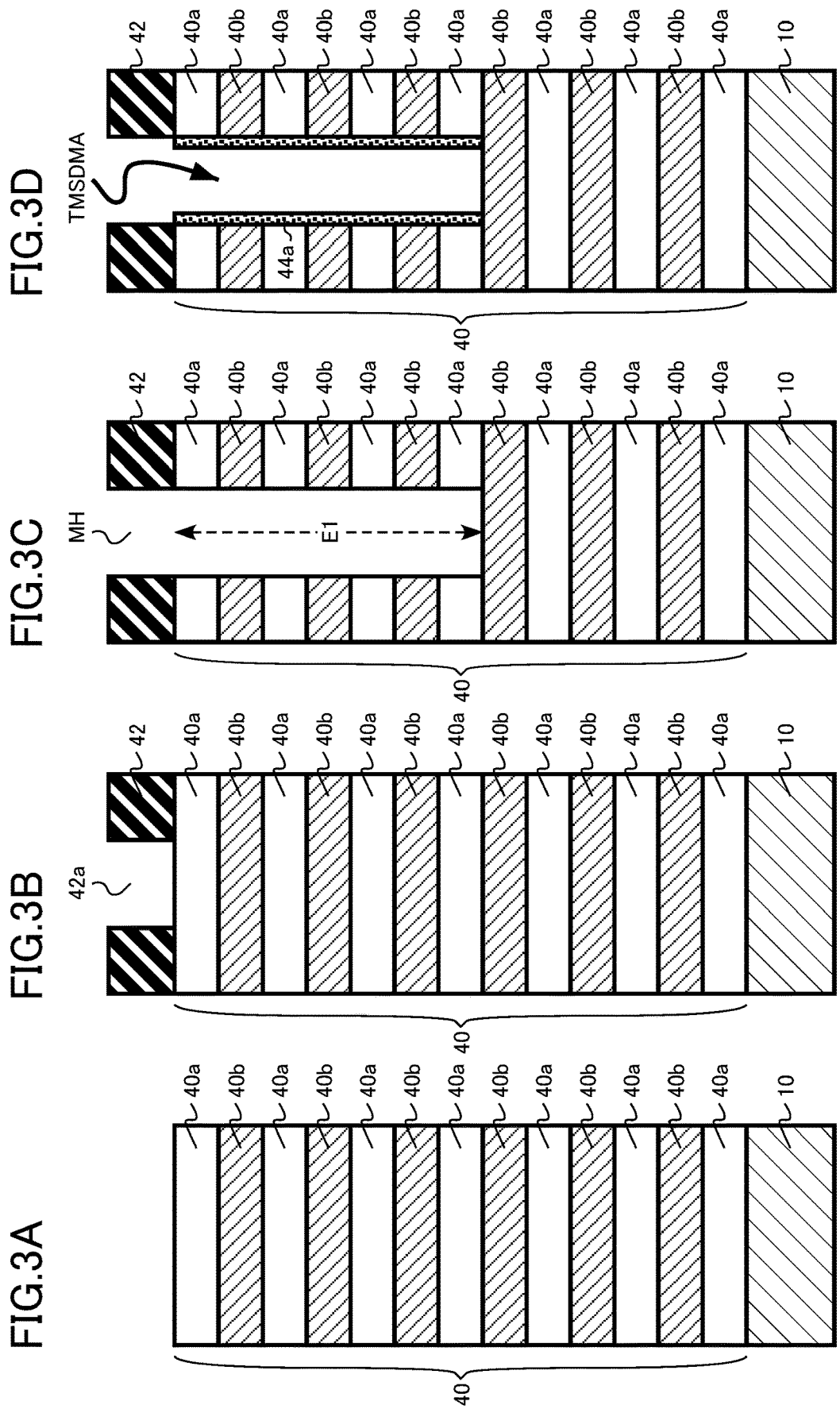

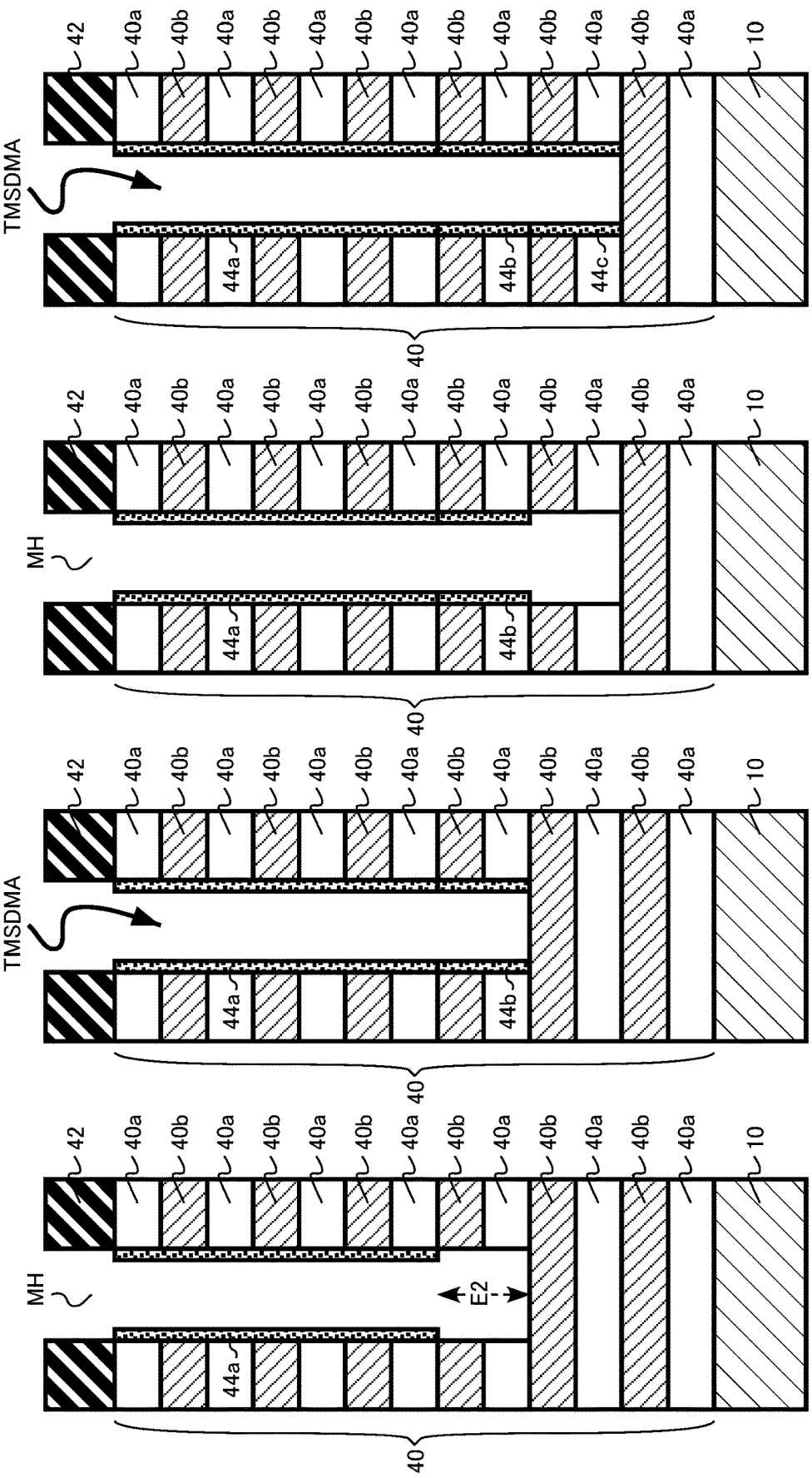

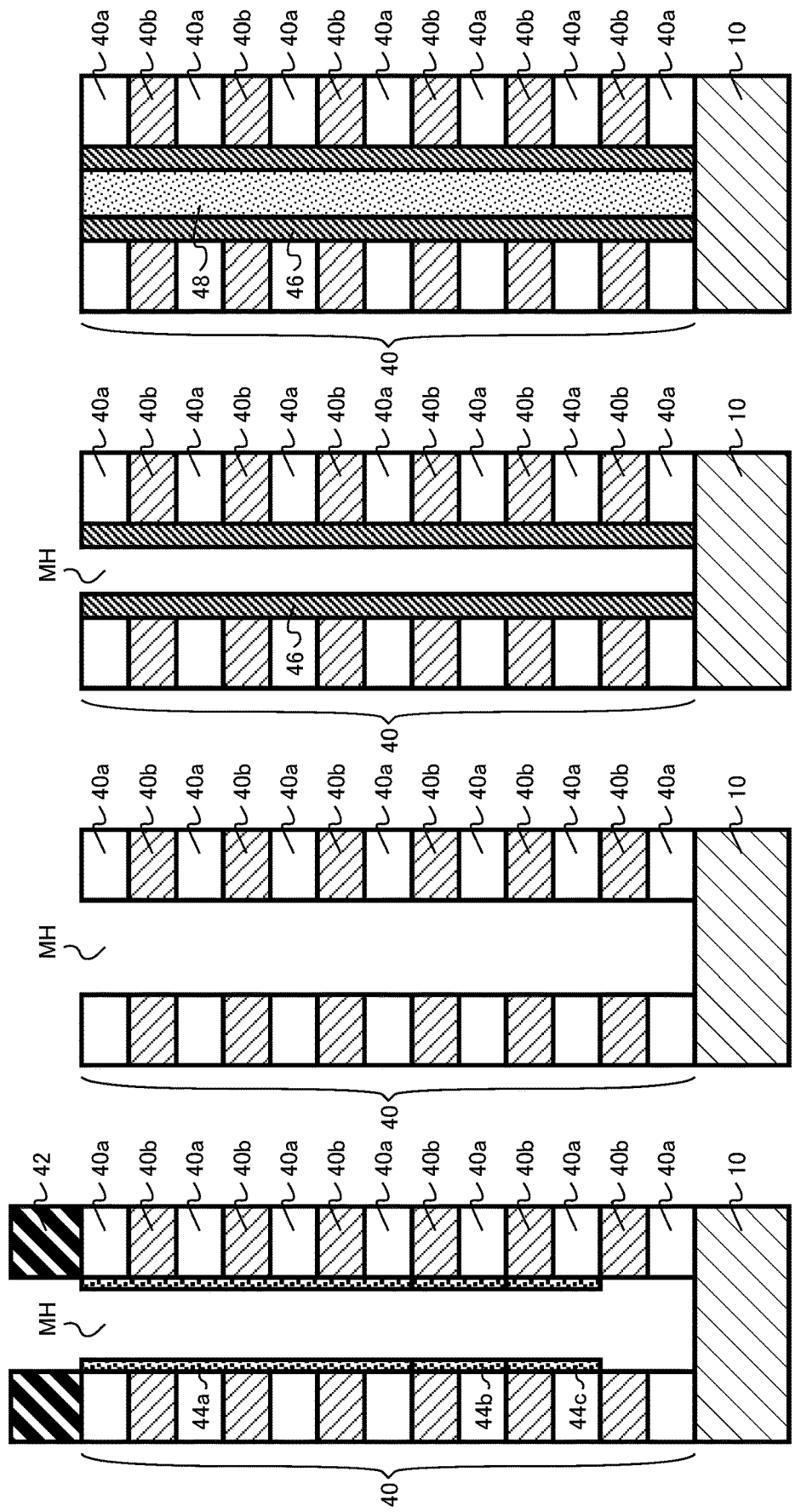

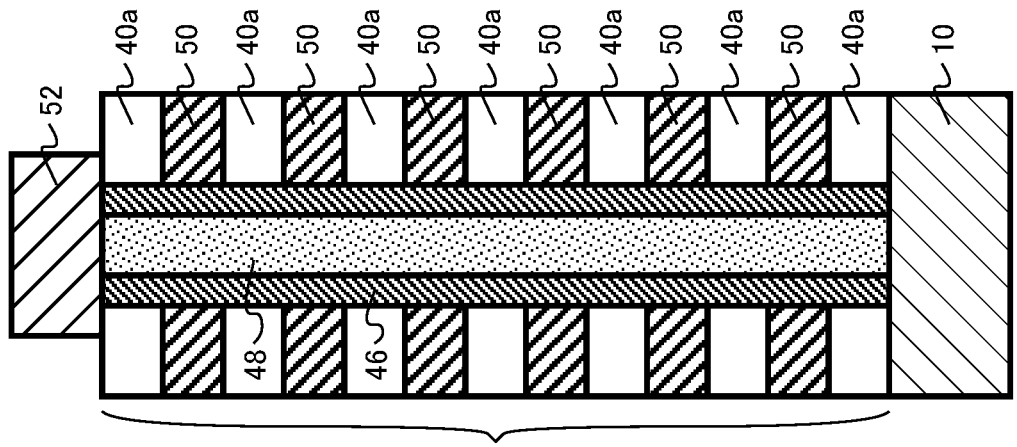
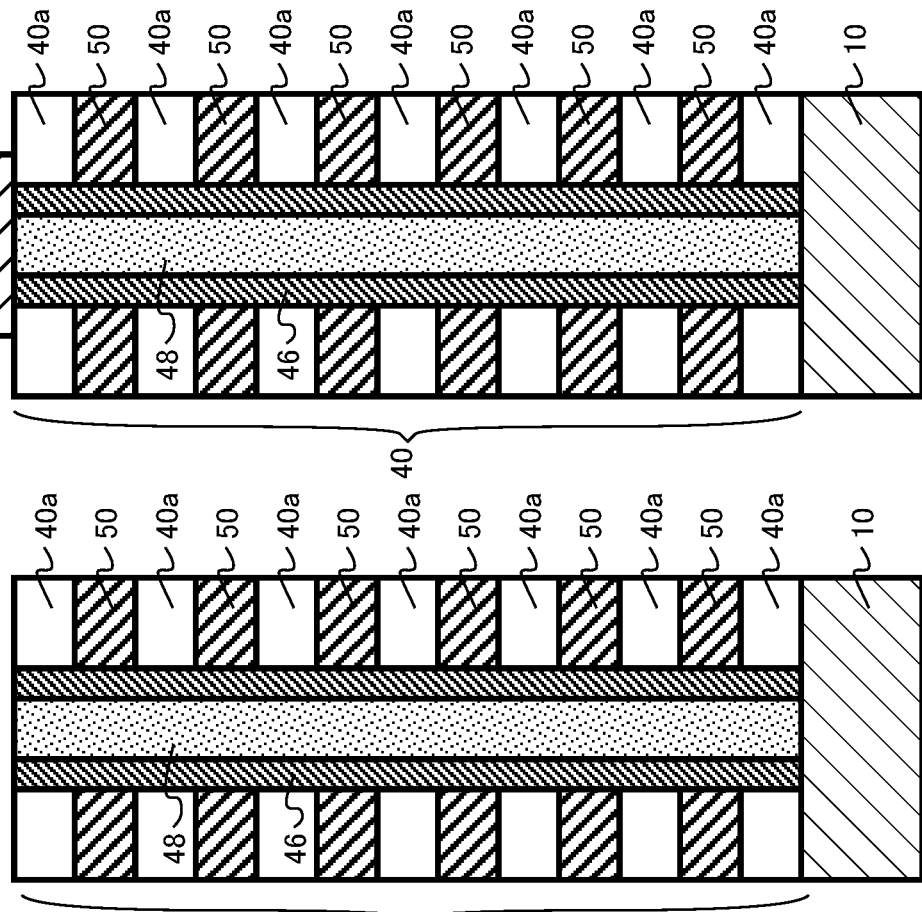
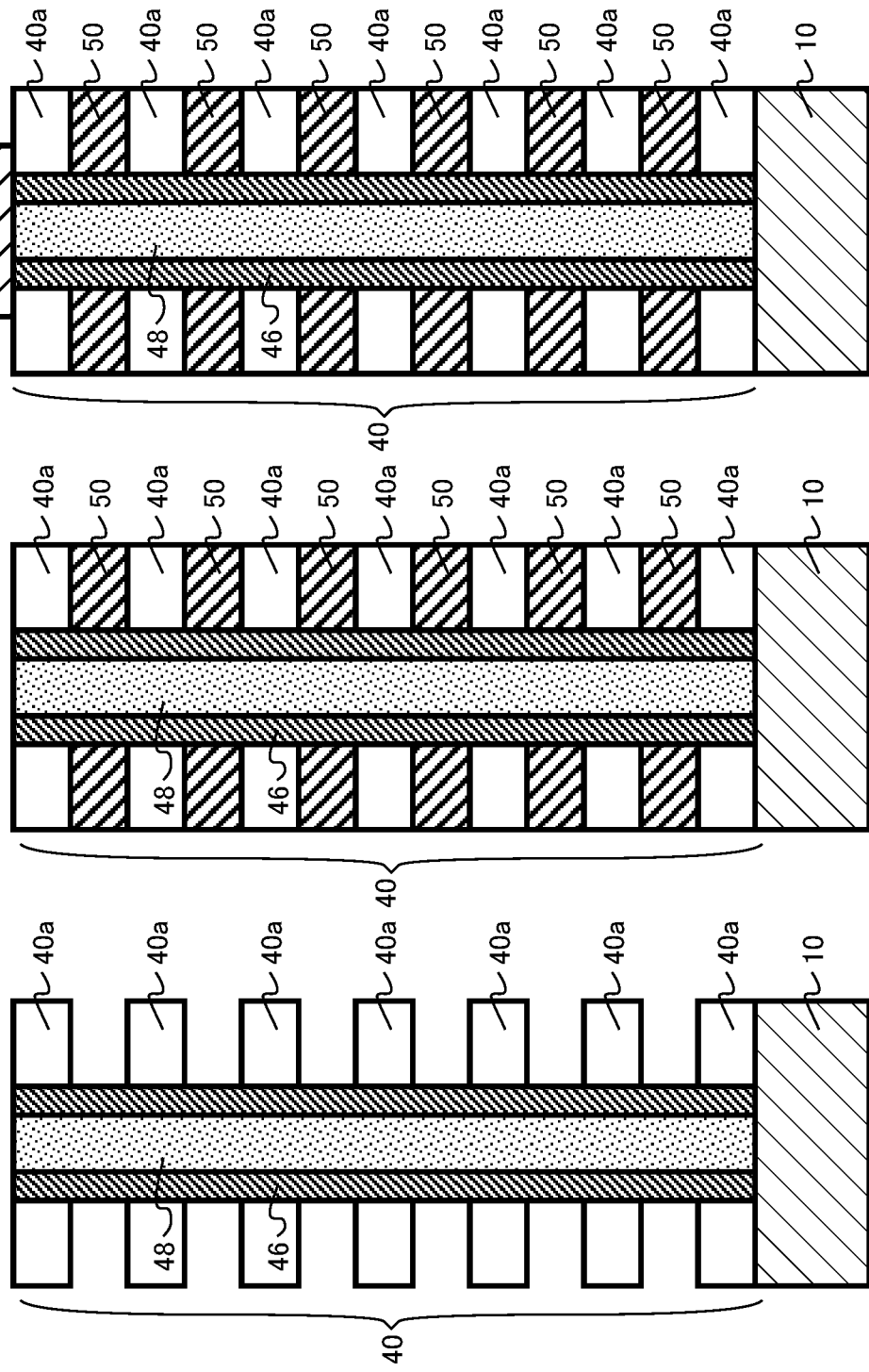

FIG.7A 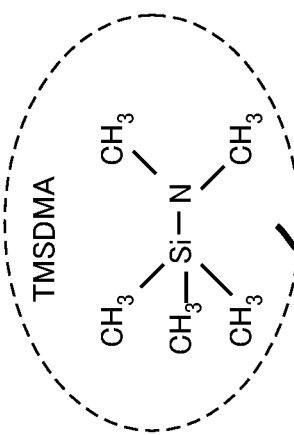 FIG.7B 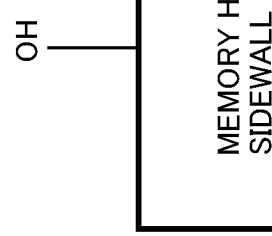 FIG.7C

MANUFACTURING METHOD FOR SEMICONDUCTOR DEVICE

CROSS-REFERENCE TO RELATED APPLICATION

This application is based upon and claims the benefit of priority from Japanese Patent Application No. 2021-012340, filed on Jan. 28, 2021, the entire contents of which are incorporated herein by reference.

FIELD

Embodiments described herein relate generally to a manufacturing method for a semiconductor device.

BACKGROUND

Along with scaling-down of a semiconductor device, it is necessary to form a recess having a high aspect ratio in a layer to be processed with high process accuracy. For example, when manufacturing a three-dimensional semiconductor memory, it is desirable to suppress the shape of the memory hole having a high aspect ratio from becoming a bowing shape.

BRIEF DESCRIPTION OF THE DRAWINGS

FIGS. 3A to 3D are schematic views showing the manufacturing method for a semiconductor device of the first embodiment;

FIGS. 4A to 4D are schematic views showing the manufacturing method for a semiconductor device of the first embodiment;

FIGS. 5A to 5D are schematic views showing the manufacturing method for a semiconductor device of the first embodiment;

FIGS. 6A to 6C are schematic views showing the manufacturing method for a semiconductor device of the first embodiment; and FIGS. 7A to 7C are explanatory views of the function of the manufacturing method for a semiconductor device of the first embodiment.

DETAILED DESCRIPTION

Figure 1:
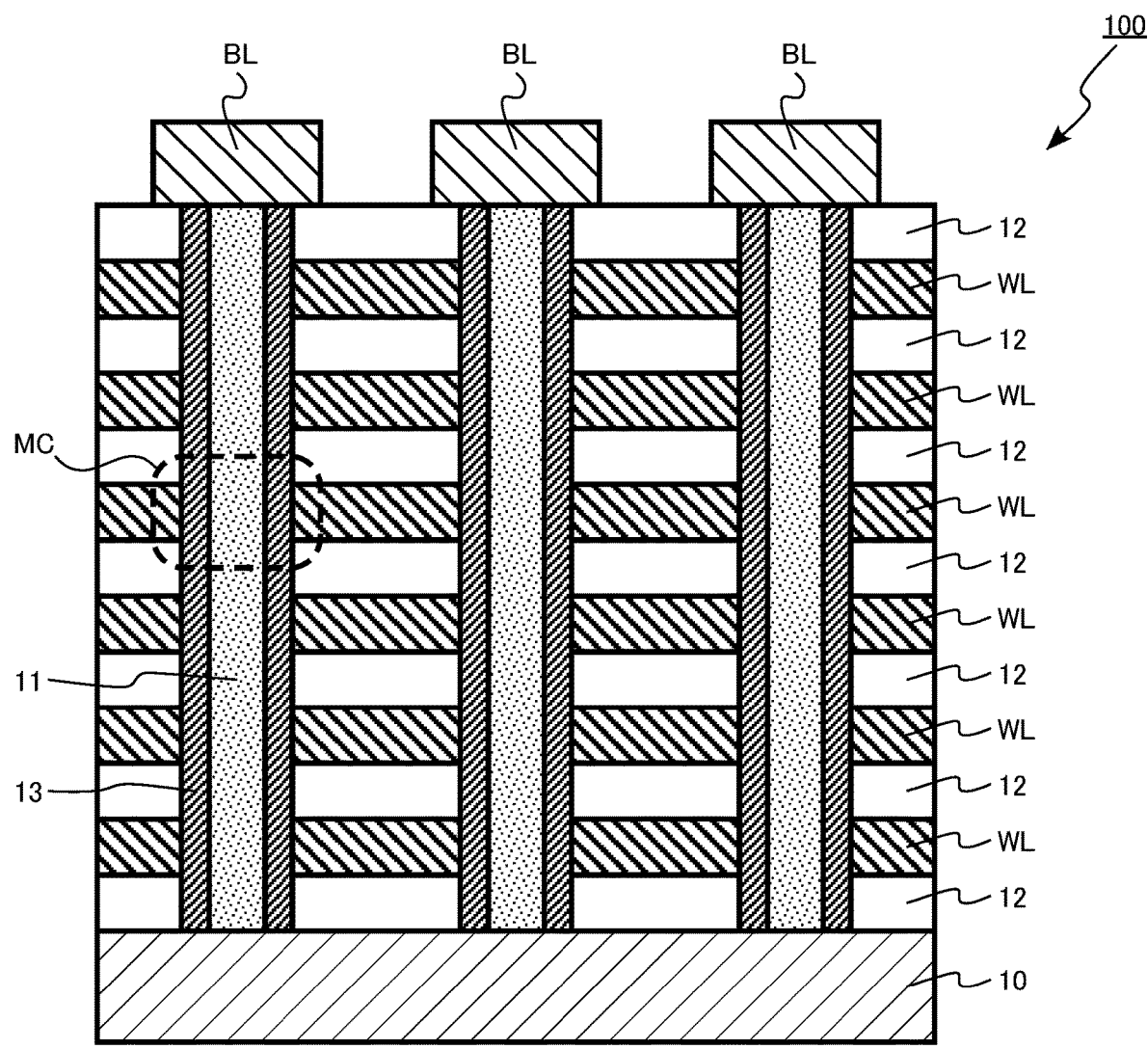
FIG. 1 is a schematic cross-sectional view of a semiconductor device manufactured by a manufacturing method for a semiconductor device according to a first embodiment.

A manufacturing method for a semiconductor device according to an embodiment includes: performing first etching for forming a recess in a layer to be processed using a reactive ion etching method; performing a first treatment of supplying a silylation agent to the recess after the performing the first etching; and performing second etching of etching a bottom surface of the recess using a reactive ion etching method after the performing the first treatment.

Embodiments of the present invention will be described below with reference to the drawings. In the following description, the identical or similar members are given the identical reference numerals, and description of the members once described will sometimes be omitted as appropriate.

In the present description, the term "up" or "down" is sometimes used for convenience. The term "up" or "down" is, for example, a term indicating a relative positional relationship in the drawings. The term "up" or "down" is not a term defining a positional relationship with respect to gravity.

Qualitative analysis and quantitative analysis of the chemical composition of the members constituting the semiconductor device in the present description can be carried out by, for example, secondary ion mass spectrometry (SIMS) and energy dispersive X-ray spectroscopy (EDX). In addition, for measuring the thickness of the members constituting the semiconductor device and the distance between the members, for example, a transmission electron microscope (TEM) or a scanning electron microscope (SEM).

The manufacturing method for a semiconductor device according to an embodiment will be described below with reference to the drawings.

First Embodiment

A manufacturing method for a semiconductor device according to a first embodiment includes: performing first etching for forming a recess in a layer to be processed using a reactive ion etching method; performing a first treatment of supplying a silylation agent to the recess after the performing the first etching; and performing second etching of etching a bottom surface of the recess using a reactive ion etching method after the performing the first treatment.

FIG. 1 is a schematic cross-sectional view of a semiconductor device manufactured by the manufacturing method for a semiconductor device according to the first embodiment. The semiconductor device manufactured by the manufacturing method for a semiconductor device according to the first embodiment is a nonvolatile memory 100 in which memory cells are three-dimensionally disposed. FIG. 1 is a cross-sectional view of a memory cell array of the nonvolatile memory 100.

The nonvolatile memory 100 includes a silicon substrate 10, a channel layer 11, a plurality of interlayer insulating layers 12, a gate insulating layer 13, a plurality of word lines WL, and a plurality of bit lines BL. The nonvolatile memory 100 includes a plurality of three-dimensionally disposed memory cells MC. The region enclosed by a dotted line in FIG. 1 corresponds to one of the memory cells MC.

The channel layer 11 extends in the normal direction of the surface of the silicon substrate 10. The channel layer 11 is electrically connected to the silicon substrate 10. The channel layer 11 functions as a channel region of a transistor of the memory cell MC. The channel layer 11 is a semiconductor. The channel layer 11 is, for example, polycrystalline silicon.

The word lines WL are stacked in the normal direction of the surface of the silicon substrate 10. The word line WL functions as a gate electrode of a transistor of the memory cell MC. The word line WL is, for example, a plate-like conductor. The word line WL is tungsten (W), for example. The channel layer 11 penetrates the plurality of word lines WL.

The interlayer insulating layer 12 is provided between the word line WL and the word line WL. The interlayer insulating layer 12 electrically separates the word line WL from the word line WL.

The bit line BL extends in a direction parallel to the surface of the silicon substrate 10. The bit line BL is electrically connected to the channel layer 11.

The gate insulating layer 13 is provided between the channel layer 11 and the word line WL. The gate insulating layer 13 includes, for example, a tunnel insulating film, a charge storage film, and a block insulating film that are not illustrated. The tunnel insulating film is a silicon oxide film, for example. The charge storage film is a silicon nitride film, for example. The block insulating film is an aluminum oxide film, for example.

The memory cell MC stores data by the charge stored in the charge storage film of the gate insulating layer 13. The threshold voltage of the transistor of the memory cell MC varies depending on the amount of the charge stored in the charge storage film. Data stored in the memory cell MC is read by monitoring the current flowing between the word line WL and the bit line BL, which varies depending on the threshold voltage of the transistor.

Figure 2:
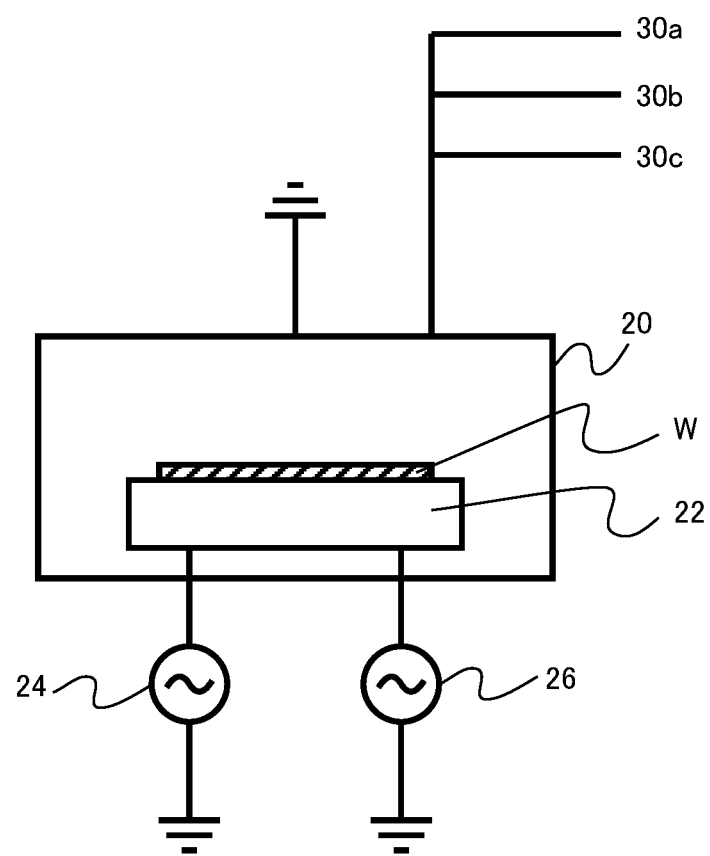
FIG. 2 is a schematic view of an example of a reactive ion etching device used in the manufacturing method for a semiconductor device according to the first embodiment.

FIG. 2 is a schematic view of an example of the reactive ion etching device used in the manufacturing method for a semiconductor device according to the first embodiment. The reactive ion etching device (RIE device) in FIG. 2 is a two-frequency capacitively coupled plasma device (CCP device).

The RIE device includes, for example, a chamber 20, a holder 22, a first high-frequency power source 24, a second high-frequency power source 26, a first gas supply port 30a, a second gas supply port 30b, and a third gas supply port 30c.

The holder 22 is provided in the chamber 20. The holder 22 mounts a semiconductor substrate W, for example. The holder 22 is, for example, an electrostatic chuck.

The first high-frequency power source 24 has a function of applying high-frequency power to the chamber 20. Plasma is generated in the chamber 20 by the first high-frequency power source 24. The high-frequency power applied by the first high-frequency power source 24 is, for example, equal to or more than 50 W and equal to or less than 5000 W. The frequency applied by the first high-frequency power source 24 is, for example, equal to or more than 20 MHz and equal to or less than 200 MHz.

The second high-frequency power source 26 has a function of applying high-frequency power to the holder 22. By applying high-frequency power to the holder 22, the energy of ions colliding with the semiconductor substrate W is controlled. The high-frequency power applied to the holder 22 is, for example, equal to or more than 100 W and equal to or less than 10000 W. The frequency applied to the holder 22 is lower than the frequency applied to the chamber 20 by the first high-frequency power source 24. The frequency applied to the holder 22 is, for example, equal to or more than 0.1 MHz and equal to or less than 10 MHz.

The semiconductor substrate W is anisotropically etched using plasma generated in the chamber 20.

Next, an example of the manufacturing method of the semiconductor device according to the first embodiment will be described.

FIGS. 3A to 3D, 4A to 4D, 5A to 5D, and 6A to 6C are schematic views showing the manufacturing method for a semiconductor device of the first embodiment. FIGS. 3A to 6C correspond to a portion including one channel layer 11 in FIG. 1.

First, a stacked body 40 is formed on the silicon substrate 10 (FIG. 3A). The stacked body 40 is an insulating layer. The stacked body 40 is an example of the layer to be processed.

The stacked body 40 includes a structure in which silicon oxide films 40a and silicon nitride films 40b are alternately stacked. The silicon oxide film 40a is an example of a first film. The silicon nitride film 40b is an example of a second film. The silicon oxide film 40a and the silicon nitride film 40b are formed by, for example, the chemical vapor deposition method (CVD method).

The interlayer insulating layer 12 eventually replaces a part of the silicon oxide film 40a.

Next, a carbon layer 42 having a hole pattern 42a is formed on the stacked body 40 (FIG. 3B). The carbon layer 42 is an example of a mask layer. The carbon layer 42 is formed by, for example, a sputtering method. The hole pattern 42a is formed using, for example, the lithography method and the RIE method.

As the mask layer, for example, a resist layer, an insulating layer, or a metal layer can also be used.

Next, the silicon substrate 10 is introduced into the chamber 20 of a RIE device. In the chamber 20 of the RIE device, the first etching is performed using the carbon layer 42 as a mask. A memory hole MH is formed in the stacked body 40 by the first etching (FIG. 3C). The memory hole MH is an example of the recess.

In the first etching, the memory hole MH does not penetrate the stacked body 40. In the first etching, the etching is stopped in the middle of the stacked body 40. The first etching amount of the stacked body 40 in the first etching is indicated by E1 in FIG. 3C.

In the first etching, the first etching gas is supplied from the first gas supply port 30a into the chamber 20, for example. The first etching is performed using the first etching gas.

Next, the first treatment of supplying trimethylsilyldimethylamine (TMSDMA) to the memory hole MH is performed (FIG. 3D). Trimethylsilyldimethylamine is an example of the silylation agent.

The first treatment is performed using the RIE device, for example. The first treatment is performed in the chamber 20 identical to that for the first etching, for example. For example, after the first etching is performed, the first etching and the first treatment are continuously performed without releasing the silicon substrate 10 into the atmosphere.

The first treatment is performed by, for example, supplying TMSDMA into the chamber 20 from the second gas supply port 30b of the RIE device. In the first treatment, TMSDMA is supplied as a gas to the memory hole MH.

By the first treatment, a protective film 44a is formed on a sidewall of the memory hole MH. The protective film 44a contains carbon.

Next, in the chamber 20 of the RIE device, the second etching is performed using the carbon layer 42 as a mask. At least a bottom surface of the memory hole MH is etched by the second etching (FIG. 4A).

The memory hole MH becomes further deeper than that immediately after the first etching. In the second etching, the memory hole MH does not penetrate the stacked body 40. In the second etching, the etching is stopped in the middle of the stacked body 40. The second etching amount of the stacked body 40 in the second etching is indicated by E2 in FIG. 4A.

For example, the first etching amount E1 of the stacked body 40 in the first etching is larger than the second etching amount E2 of the stacked body 40 in the second etching. The first etching amount E1 may be equal to or smaller than the second etching amount E2.

In the second etching, the second etching gas is supplied from the first gas supply port 30a into the chamber 20, for example. The second etching is performed using the second etching gas.

Next, a second treatment of supplying TMSDMA to the memory hole MH is performed (FIG. 4B). TMSDMA is an example of the silylation agent.

The second treatment is performed using the RIE device, for example. The second treatment is performed in the chamber 20 identical to that for the second etching, for example. For example, after the second etching is performed, the second etching and the second treatment are continuously performed without releasing the silicon substrate 10 into the atmosphere.

The second treatment is performed by supplying TMSDMA into the chamber 20 from the second gas supply port 30b of the RIE device. TMSDMA is supplied as a gas to the memory hole MH.

By the second treatment, a protective film 44b is formed on the sidewall of the memory hole MH. The protective film 44b contains carbon.

Next, in the chamber 20 of the RIE device, third etching is performed using the carbon layer 42 as a mask. At least a bottom surface of the memory hole MH is etched by the third etching (FIG. 4C).

The memory hole MH becomes further deeper than that immediately after the second etching. In the third etching, the memory hole MH does not penetrate the stacked body 40. In the third etching, the etching is stopped in the middle of the stacked body 40.

In the third etching, the third etching gas is supplied from the first gas supply port 30a into the chamber 20, for example. The third etching is performed using the third etching gas.

Next, a third treatment of supplying TMSDMA to the memory hole MH is performed (FIG. 4D). TMSDMA is an example of the silylation agent.

The third treatment is performed using the RIE device, for example. The third treatment is performed in the chamber 20 identical to that for the third etching, for example. For example, after the third etching is performed, the third etching and the third treatment are continuously performed without releasing the silicon substrate 10 into the atmosphere.

The third treatment is performed by, for example, supplying TMSDMA into the chamber 20 from the second gas supply port 30b of the RIE device. TMSDMA is supplied as a gas to the memory hole MH.

By the third treatment, a protective film 44c is formed on the sidewall of the memory hole MH. The protective film 44c contains carbon.

Next, in the chamber 20 of the RIE device, fourth etching is performed using the carbon layer 42 as a mask. At least a bottom surface of the memory hole MH is etched by the fourth etching (FIG. 5A).

The memory hole MH becomes further deeper than that immediately after the third etching. In the fourth etching, the memory hole MH penetrates the stacked body 40 and reaches the silicon substrate 10.

In the fourth etching, the fourth etching gas is supplied from the first gas supply port 30a into the chamber 20, for example. The fourth etching is performed using the fourth etching gas.

The aspect ratio of the memory hole MH penetrating the stacked body 40 is equal to or more than 30, for example.

After the fourth etching, the silicon substrate 10 is taken out from the chamber 20 of the RIE device.

The first etching gas, the second etching gas, the third etching gas, and the fourth etching gas contain, for example, carbon and fluorine. The first etching gas, the second etching gas, the third etching gas, and the fourth etching gas contain, for example, oxygen. The first etching gas, the second etching gas, the third etching gas, and the fourth etching gas contain, for example, hydrogen.

The first etching gas, the second etching gas, the third etching gas, and the fourth etching gas contain, for example, $C_xH_yF_z$ (x is an integer of equal to or more than 1, y is an integer of equal to or more than 0, and z is an integer of equal to or more than 1). The first etching gas, the second etching gas, the third etching gas, and the fourth etching gas contain, for example, $C_4F_6$, $C_4F_8$, and $CH_2F_2$.

The first etching gas, the second etching gas, the third etching gas, and the fourth etching gas contain, for example, oxygen gas.

The first etching gas, the second etching gas, the third etching gas, and the fourth etching gas are, for example, mixed gases of $C_4F_6$, $C_4F_8$, and $CH_2F_2$, and oxygen gas.

The first etching gas, the second etching gas, the third etching gas, and the fourth etching gas are, for example, the identical gas. For example, at least one of the first etching gas, the second etching gas, the third etching gas, and the fourth etching gas is different from the other gases.

The silylation agent is a chemical that realizes silylation. Silylation means substituting active hydrogen on the substance with a trisubstituted silyl group (—$SiR_3$). The silylation agent contains silicon.

The silylation agent contains, for example, carbon and hydrogen. The silylation agent contains, for example, a methyl group, an alkyl group, or a phenyl group.

The silylation agent contains, for example, an amino group. The silylation agent has, for example, a structure of $(R_3)$—Si—$N(R_2)$. The silylation agent is, for example, trimethylsilyldimethylamine (TMSDMA), bistertiarybutylaminosilane (BTBAS), bis(dimethylamino)dimethylsilane (BDMADMS), or phenyldimethylsilyldimethylamine.

The silylation agent contains, for example, a methoxy group. The silylation agent has, for example, a structure of R—Si—$(O(Me))x$. The silylation agent has, for example, a structure of $CH_3$—$(CH_2)z$-Si—$(O$-$Me)_3$. The silylation agent is, for example, trimethylmethoxysilane (TMSOME), dimethylmethoxysilane (DMDMS), methyltrimethoxysilane (MTMS), or methoxydimethylphenylsilane.

The silylation agents used in the first treatment, the second treatment, and the third treatment are identical, for example. Moreover, in the silylation agents used in the first treatment, the second treatment, and the third treatment, for example, the silylation agent used in at least one treatment is different from the silylation agents used in the other treatments.

Next, the carbon layer 42, the protective film 44a, the protective film 44b, and the protective film 44c are removed (FIG. 5B). The removal of the carbon layer 42, the protective film 44a, the protective film 44b, and the protective film 44c is performed using, for example, a different device or a different condition from that for the first to fourth etching. The removal of the carbon layer 42, the protective film 44a, the protective film 44b, and the protective film 44c is performed using, for example, a different gas from that for the first to fourth etching. The removal of the carbon layer 42, the protective film 44a, the protective film 44b, and the protective film 44c is performed by, for example, asking treatment using oxygen plasma.

Next, a stacked insulating layer 46 is formed in the memory hole MH (FIG. 5C). The stacked insulating layer 46 has a stacked structure of a silicon oxide film, a silicon nitride film, and an aluminum oxide film, for example. The stacked insulating layer 46 eventually becomes the gate insulating layer 13.

Next, a polycrystalline silicon layer 48 is formed in the memory hole MH (FIG. 5D). The polycrystalline silicon layer 48 eventually becomes the channel layer 11.

Next, the silicon nitride film 40b is selectively removed (FIG. 6A).

Next, a first tungsten layer 50 is formed in the region from which the silicon nitride film 40b has been removed (FIG. 6B). The first tungsten layer 50 eventually becomes the word line WL.

Next, a second tungsten layer 52 is formed on the polycrystalline silicon layer 48 (FIG. 6C). The second tungsten layer 52 eventually becomes the bit line BL.

The nonvolatile memory 100 shown in FIG. 1 is manufactured by the above manufacturing method.

Next, functions and effects of the semiconductor device and the manufacturing method of the semiconductor device of the first embodiment will be described.

In the nonvolatile memory 100 in which the memory cells are three-dimensionally disposed, in order to increase the capacity of the memory, for example, the hole diameter of the memory hole is reduced and the number of stacked word lines WL is increased. When the hole diameter of the memory hole is reduced and the number of stacked word lines WL is increased, it is necessary to form a memory hole having a high aspect ratio (depth of memory hole/hole diameter of memory hole).

An increase in the aspect ratio of the memory hole causes a problem that the memory hole has a bowing shape.

The bowing shape of the memory hole is caused by the hole diameter widening in the middle of etching for forming the memory hole. As a cause of the hole diameter widening in the middle of etching, it is conceivable that a part of the protective film formed on the sidewall of the memory hole disappears during etching.

In etching of the memory hole, a substance derived from the plasma etching gas adheres to the sidewall, and a protective film is formed on the sidewall. Forming the protective film on the sidewall of the memory hole prevents etching of the sidewall, and suppresses the hole diameter from widening. When the protective film on the sidewall of the memory hole disappears, etching of the sidewall of the memory hole progresses, and the hole diameter of the memory hole widens.

The protective film formed on the sidewall of the memory hole is, for example, a fluorocarbon film containing carbon and fluorine.

The thickness of the protective film formed on the sidewall of the memory hole is determined by the balance between the amount of the substance adhering to the sidewall and the etching amount of the substance adhering to the sidewall.

For example, on the sidewall of a shallow portion of the memory hole, the plasma etching gas easily reaches, and the amount of the substance adhering to the sidewall increases. On the other hand, in the shallow portion of the memory hole, the amount of obliquely incident ions is large, and the time of being exposed to etching becomes long. For this reason, the etching amount of the substance adhering to the sidewall also increases. There is a risk that the etching amount exceeds the amount of the substance adhering to the sidewall, the protective film on the sidewall disappears, and the hole diameter of the memory hole widens.

For example, on the sidewall of a deep portion of the memory hole, the plasma etching gas hardly reaches, and the amount of the substance adhering to the sidewall decreases. Therefore, when the etching amount exceeds the amount of the substance adhering to the sidewall, there is a risk that the protective film on the sidewall disappears and the hole diameter of the memory hole widens.

In the manufacturing method for a semiconductor device according to the first embodiment, when the memory hole MH is formed, etching of the stacked body 40, which is a layer to be processed, and treatment using the silylation agent are alternately performed. By the treatment using the silylation agent, the protective film is formed on the sidewall of the memory hole. By the treatment using the silylation agent, a new protective film is formed also in a portion where the protective film formed at the time of etching disappears. Therefore, it is considered that the shape of the memory hole can be suppressed from becoming a bowing shape.

FIGS. 7A to 7C are explanatory views of the function of the manufacturing method for a semiconductor device of the first embodiment.

As shown in FIG. 7A, a hydroxyl group (—OH) exists on the surfaces of the silicon oxide film 40a and the silicon nitride film 40b exposed on the sidewall of the memory hole MH. As shown in FIG. 7B, in the manufacturing method for the nonvolatile memory 100 of the first embodiment, TMSDMA, which is a silylation agent, is supplied to the surface of the sidewall of the memory hole MH in the first treatment, the second treatment, and the third treatment.

As shown in FIG. 7C, the Si—N bond of TMSDMA supplied to the surface of the sidewall of the memory hole MH is broken, and a trimethylsilyl group is bonded to the surface of the sidewall. The trimethylsilyl group is bonded to the surface of the sidewall of the memory hole MH by a silylation reaction.

The protective film 44a, the protective film 44b, and the protective film 44c formed by the first treatment, the second treatment, and the third treatment include, for example, trimethylsilyl groups formed by the silylation reaction.

The silylation reaction is highly reactive and easily occurs even at a low temperature. For the silylation reaction, it is not necessary to bring the material into plasma and form ions and radicals.

Since the silylation reaction is highly reactive, the protective film is easily formed even in the deep portion of the memory hole MH. When the surface of the sidewall is completely covered with the trimethylsilyl group, the silylation reaction ends. Therefore, the formation of the protective film is a self-limiting process. Therefore, it is considered that the protective film 44a, the protective film 44b, and the protective film 44c formed on the sidewall by the first treatment, the second treatment, and the third treatment are formed to have uniform thicknesses.

It is considered that formation of the protective film 44a, the protective film 44b, and the protective film 44c suppresses etching of the sidewall, and can suppress the shape of the memory hole MH from becoming a bowing shape.

In the manufacturing method for the nonvolatile memory 100 of the first embodiment, the first etching, the first treatment, the second etching, the second treatment, the third etching, the third treatment, and the fourth etching are continuously performed in the identical chamber 20 of the identical RIE device. Therefore, the manufacturing time of the nonvolatile memory 100 is shortened, and an increase in the manufacturing cost of the nonvolatile memory 100 can be suppressed.

The first to fourth etching gases preferably contain oxygen. The first to fourth etching gases preferably contain oxygen gas.

When oxygen or oxygen gas is contained in the first to fourth etching gases, the surface of the silicon nitride film 40b on the sidewall of the memory hole MH is oxidized. Therefore, the surface state of the silicon oxide film 40a exposed to the sidewall resembles the surface state of the silicon nitride film 40b. Therefore, the silylation reaction on the surface of the silicon oxide film 40a and the silylation reaction on the surface of the silicon nitride film 40b progress similarly. Therefore, the protective film 44a, the protective film 44b, and the protective film 44c become uniform films. Hence, the silicon nitride film 40b on the sidewall is suppressed from being selectively etched with respect to the silicon oxide film 40a on the sidewall.

The first to fourth etching gases preferably contain hydrogen. When the first to fourth etching gases contain hydrogen, the etching rate of the silicon nitride film 40b increases. Therefore, the etching time of the first to fourth etching can be shortened.

The first etching amount E1 of the stacked body 40 in the first etching is preferably larger than the second etching amount E2 of the stacked body 40 in the second etching. If the silylation reaction in the deep portion of the memory hole MH is suppressed, there is a risk that the protective film 44b in the deep portion of the memory hole MH becomes thin. By making the second etching amount E2 smaller than the first etching amount E1, etching of the sidewall in the second etching is suppressed. This can suppress the shape of the memory hole MH from becoming a bowing shape. The first etching amount E1 may be equal to or smaller than the second etching amount E2.

In the first to fourth etching, the high-frequency power applied to the holder 22 on which the stacked body 40 is mounted is preferably equal to or more than 500 W, more preferably equal to or more than 750 W, and yet more preferably equal to or more than 1000 W. As the high-frequency power applied to the holder 22 becomes high, the energy of ions colliding with the stacked body 40 in the first to fourth etching becomes high. Therefore, it becomes easy to form the memory hole MH having a high aspect ratio.

As described above, according to the manufacturing method for a semiconductor device of the first embodiment, it is possible to suppress the shape of the memory hole from becoming a bowing shape, and to form the memory hole with high process accuracy.

Second Embodiment

The manufacturing method for a semiconductor device of the second embodiment is different from the manufacturing method of the first embodiment in that the first to third treatments are performed by a device different from the RIE device that performs the first to fourth etching processes. Hereinafter, part of description of the contents overlapping the first embodiment may be omitted.

In the manufacturing method for a semiconductor device of the second embodiment, the first to third treatments are performed using a wet etching device.

For example, after the first etching shown in FIG. 3C, the silicon substrate 10 is taken out from the chamber 20 of the RIE device. Next, the first treatment is performed using the wet etching device.

For example, TMSDMA is applied to the surface of the silicon substrate 10. For example, the silicon substrate 10 is immersed in TMSDMA. In the first treatment, TMSDMA is supplied as a liquid to the memory hole MH.

After the first treatment, the silicon substrate 10 is introduced into the chamber 20 of the RIE device, and the second etching is performed.

Thereafter, the second treatment is performed using the wet etching device, the third etching is performed using the RIE device, the third treatment is performed using the wet etching device, and the fourth etching is performed using the RIE device.

As described above, according to the manufacturing method for a semiconductor device of the second embodiment, similarly to the first embodiment, it is possible to suppress the shape of the memory hole from becoming a bowing shape, and to form the memory hole with high process accuracy.

Third Embodiment

The manufacturing method for a semiconductor device of the third embodiment is different from the manufacturing method of the first or second embodiment in that the treatment time of the first treatment and the treatment time of the second treatment are different. Hereinafter, part of description of the contents overlapping the first or second embodiment may be omitted.

In the manufacturing method for a semiconductor device of the third embodiment, for example, the treatment time of the second treatment is longer than the treatment time of the first treatment. The treatment time of the second treatment of forming the protective film 44b in the deep portion of the memory hole MH is made longer than the treatment time of the first treatment. By lengthening the treatment time of the second treatment, for example, the uniformity of the protective film 44b is improved.

In the manufacturing method for a semiconductor device of the third embodiment, for example, the treatment time of the second treatment is shorter than the treatment time of the first treatment. In the deep portion of the memory hole MH, the memory hole diameter sometimes becomes small due to a forward tapered shape of the memory hole MH. By shortening the treatment time of the second treatment, the protective film 44b attached to a portion having a small memory hole diameter is thinned. By thinning the protective film 44b, for example, it is possible to suppress reduction in the etching rate of the stacked body 40 in the third etching.

As described above, according to the manufacturing method for a semiconductor device of the third embodiment, similarly to the first or second embodiment, it is possible to suppress the shape of the memory hole from becoming a bowing shape, and to form the memory hole with high process accuracy.

Fourth Embodiment

The manufacturing method for a semiconductor device of the fourth embodiment is different from the manufacturing method of the first embodiment in that water is supplied to the recess after the first etching before the first treatment. Hereinafter, part of description of the contents overlapping the first embodiment may be omitted.

In the manufacturing method for a semiconductor device of the fourth embodiment, for example, water is supplied to the memory hole MH formed in the stacked body 40 after the first etching before the first treatment.

For example, after the first etching shown in FIG. 3C, water is supplied from the third gas supply port 30c into the chamber 20. Water is supplied as a gas into the chamber 20. Water vapor is supplied into the chamber 20.

Next, the first treatment shown in FIG. 3D is performed.

By supplying water to the memory hole MH after the first etching, for example, the area density and uniformity of the hydroxyl group (—OH) on the surface of the sidewall of the memory hole MH are increased. Therefore, the formation of the protective film 44a in the first treatment is promoted.

Therefore, for example, the uniformity of the protective film 44a is improved. Furthermore, for example, the treatment time of the first treatment can be shortened.

For example, water may be supplied to the memory holes MH formed in the stacked body 40 between the second etching and the second treatment and between the third etching and the third treatment.

As described above, according to the manufacturing method for a semiconductor device of the fourth embodiment, similarly to the first embodiment, it is possible to suppress the shape of the memory hole from becoming a bowing shape, and to form the memory hole with high process accuracy.

Fifth Embodiment

The manufacturing method for a semiconductor device of the fifth embodiment is different from the manufacturing method of the first embodiment in that oxygen is supplied to the recess after the first etching before the first treatment. Hereinafter, part of description of the contents overlapping the first embodiment may be omitted.

In the manufacturing method for a semiconductor device of the fifth embodiment, for example, oxygen is supplied to the memory hole MH formed in the stacked body 40 after the first etching before the first treatment.

For example, after the first etching shown in FIG. 3C, oxygen gas is supplied from the third gas supply port 30c into the chamber 20. High-frequency power is applied, and the oxygen gas becomes oxygen plasma in the chamber 20.

Next, the first treatment shown in FIG. 3D is performed.

After the first etching, by supplying oxygen plasma to the memory hole MH, for example, oxidation of the surface of the silicon nitride film 40b on the sidewall of the memory hole MH progresses. Therefore, the surface state of the silicon oxide film 40a exposed to the sidewall resembles the surface state of the silicon nitride film 40b. Therefore, the silylation reaction on the surface of the silicon oxide film 40a in the first treatment and the silylation reaction on the surface of the silicon nitride film 40b progress similarly. Therefore, the uniformity of the protective film 44a is improved. Hence, the silicon nitride film 40b on the sidewall is suppressed from being selectively etched with respect to the silicon oxide film 40a on the sidewall.

For example, oxygen may be supplied to the memory holes MH formed in the stacked body 40 between the second etching and the second treatment and between the third etching and the third treatment.

As described above, according to the manufacturing method for a semiconductor device of the fifth embodiment, similarly to the first embodiment, it is possible to suppress the shape of the memory hole from becoming a bowing shape, and to form the memory hole with high process accuracy.

Sixth Embodiment

The manufacturing method for a semiconductor device of the sixth embodiment is different from the manufacturing method of the first to fifth embodiments in that the layer to be processed is a single layer. Hereinafter, part of description of the contents overlapping the first to fifth embodiment may be omitted.

In the manufacturing method for a semiconductor device of the sixth embodiment, the layer to be processed is a single layer. In other words, there is no stacked structure in which the layer to be processed is formed of two or more types of different films.

The layer to be processed is, for example, an insulating layer of a single layer. The insulating layer is, for example, an oxide layer, a nitride layer, or an oxynitride layer.

The layer to be processed is, for example, a metal layer of a single layer. The layer to be processed is, for example, a semiconductor layer of a single layer. The semiconductor layer is, for example, a silicon layer of a single crystal or polycrystalline.

In the manufacturing method for a semiconductor device of the sixth embodiment, the pattern of the recess to be formed is, for example, a hole pattern or a groove pattern.

As described above, according to the manufacturing method for a semiconductor device of the sixth embodiment, by a function similar to that in the first to fifth embodiments, it is possible to suppress the shape of the memory hole from becoming a bowing shape, and to form the memory hole with high process accuracy.

In the first to fifth embodiments, the case where the etching is performed four times and the treatment of supplying the silylation agent between the etching is performed three times has been described by way of example. However, the number of times of etching is not limited to four and the number of times of the treatment of supplying the silylation agent is not limited to three. The number of times of etching may be any number as long as it is equal to or more than two, and the number of times of treatment of supplying the silylation agent may be any number as long as it is equal to or more than one.

In the first to fifth embodiments, the case where the semiconductor device is a nonvolatile memory has been described by way of example. However, the semiconductor device is not limited to a nonvolatile memory.

In the first embodiment, the case where the first film of the layer to be processed is a silicon oxide film and the second film is a silicon nitride film has been described by way of example. However, the first film and the second film are not limited to a combination of a silicon oxide film and a silicon nitride film as long as they are different films. For example, a combination of an insulating film and a semiconductor film, or a combination of an insulating film and a metal film may be adopted.

While certain embodiments have been described, these embodiments have been presented by way of example only, and are not intended to limit the scope of the inventions. Indeed, the manufacturing method for a semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A manufacturing method for a semiconductor device comprising:
    performing first etching for forming a recess in a layer to be processed using a reactive ion etching method;
    performing a first treatment of supplying a silylation agent to the recess after the performing the first etching, a side film including carbon being formed on a sidewall of the recess by the first treatment, the side film being formed directly on the layer to be processed by silylation reaction; and performing second etching of etching a bottom surface of the recess using a reactive ion etching method after the performing the first treatment, wherein the silylation agent contains at least one chemical selected from the group consisting of phenyldimethylsilvldimethylamine, trimethylmethoxysilane, dimethylmethoxysilane, methyltrimethoxysilane, and methoxydimethylphenylsilane.

2. The manufacturing method for a semiconductor device according to claim 1, wherein the layer to be processed contains silicon or metal.

3. The manufacturing method for a semiconductor device according to claim 1, wherein the layer to be processed includes a structure in which a first film and a second film different from the first film are alternately stacked.

4. The manufacturing method for a semiconductor device according to claim 3, wherein the first film is a silicon oxide film, and the second film is a silicon nitride film.

5. The manufacturing method for a semiconductor device according to claim 1, wherein a gas containing carbon and fluorine is used in the first etching.

6. The manufacturing method for a semiconductor device according to claim 1, wherein a gas containing oxygen is used in the first etching.

7. The manufacturing method for a semiconductor device according to claim 1, further comprising:

forming a mask layer having a pattern on the layer to be processed before the performing the first etching, wherein the recess is formed using the mask layer as a mask in the performing the first etching.

8. The manufacturing method for a semiconductor device according to claim 7, wherein a side surface of the mask layer is exposed after the performing the first treatment.

9. The manufacturing method for a semiconductor device according to claim 1, further comprising:

performing a second treatment of supplying a silylation agent to the recess after the performing the second etching; and performing third etching of etching a bottom surface of the recess using a reactive ion etching method after the performing the second treatment.

10. The manufacturing method for a semiconductor device according to claim 9, wherein a treatment time of the first treatment and a treatment time of the second treatment are different.

11. The manufacturing method for a semiconductor device according to claim 1, wherein in the first etching, power of equal to or more than 500 W is applied to a holder on which the layer to be processed is mounted.

12. The manufacturing method for a semiconductor device according to claim 1, further comprising:

supplying water to the recess after the performing the first etching before the performing the first treatment.

13. The manufacturing method for a semiconductor device according to claim 1, further comprising:

supplying oxygen to the recess after the performing the first etching before the performing the first treatment.

14. The manufacturing method for a semiconductor device according to claim 1, wherein the silylation agent is supplied as a liquid.

15. The manufacturing method for a semiconductor device according to claim 1, wherein the silylation agent is supplied as a gas.

16. The manufacturing method for a semiconductor device according to claim 1, wherein the first etching, the first treatment, and the second etching are performed in an identical chamber.

17. The manufacturing method for a semiconductor device according to claim 1, wherein the side film includes a methyl group, an amino group, or a methoxy group.

18. The manufacturing method for a semiconductor device according to claim 1, wherein the side film includes a trisubstituted silyl group.

19. The manufacturing method for a semiconductor device according to claim 1, wherein the side film is formed directly on an upper end of a side surface of the layer to be processed.

20. The manufacturing method for a semiconductor device according to claim 1, wherein the side film is formed selectively on the layer to be processed.

21. A manufacturing method for a semiconductor device comprising:

performing first etching for forming a recess in a layer to be processed using a reactive ion etching method;

performing a first treatment of supplying a silylation agent to the recess after the performing the first etching, a side film including carbon being formed on a sidewall of the recess by the first treatment, the side film being formed directly on the layer to be processed by silylation reaction; and performing second etching of etching a bottom surface of the recess using a reactive ion etching method after the performing the first treatment, wherein the silylation agent contains a methoxy group.

22. A manufacturing method for a semiconductor device comprising:

forming a mask layer having a pattern on the layer to be processed, performing first etching for forming a recess using the mask layer as a mask in a layer to be processed using a reactive ion etching method;

performing a first treatment of supplying a silylation agent to the recess after the performing the first etching, a side film including carbon being formed on a sidewall of the recess by the first treatment, the side film being formed directly on the layer to be processed by silylation reaction; and performing second etching of etching a bottom surface of the recess using a reactive ion etching method after the performing the first treatment, wherein the side film is not formed on a side surface of the mask layer after the performing the first treatment.

\* \* \* \* \*